United States Patent
Chuang et al.

(10) Patent No.: US 10,164,627 B1
(45) Date of Patent: Dec. 25, 2018

(54) POWER-ON CONTROL CIRCUIT

(71) Applicant: Vanguard International Semiconductor Corporation, Hsinchu (TW)

(72) Inventors: Jung-Tsun Chuang, Tainan (TW); Shao-Chang Huang, Hsinchu (TW); Chieh-Yao Chuang, Kaohsiung (TW); Hung-Wei Chen, Jhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/692,672

(22) Filed: Aug. 31, 2017

(51) Int. Cl.
| | |
|---|---|
| *H03K 17/22* | (2006.01) |
| *H02M 3/158* | (2006.01) |
| *H02M 1/36* | (2007.01) |
| *H03K 17/687* | (2006.01) |
| *H03K 19/0185* | (2006.01) |
| *H03K 3/3565* | (2006.01) |
| *G04G 19/06* | (2006.01) |

(52) U.S. Cl.
CPC ........... *H03K 17/223* (2013.01); *G04G 19/06* (2013.01); *H02M 1/36* (2013.01); *H02M 3/158* (2013.01); *H03K 3/3565* (2013.01); *H03K 17/6871* (2013.01); *H03K 19/018507* (2013.01)

(58) Field of Classification Search
CPC .............................. H03K 17/22; H03K 17/223
See application file for complete search history.

(56) References Cited

U.S. PATENT DOCUMENTS

| | | | |
|---|---|---|---|
| 5,477,176 A | * | 12/1995 | Chang ................... G11C 5/143 327/142 |
| 6,323,704 B1 | | 11/2001 | Pelley et al. |
| 6,586,974 B1 | | 7/2003 | Humphrey et al. |
| 7,378,896 B2 | | 5/2008 | Wong et al. |
| 8,570,077 B2 | * | 10/2013 | Kwon ....................... G06F 1/26 327/143 |

(Continued)

FOREIGN PATENT DOCUMENTS

| | | |
|---|---|---|
| TW | 201607198 A | 2/2016 |
| TW | 201633714 A | 9/2016 |
| WO | WO 2012/083288 A1 | 6/2012 |

OTHER PUBLICATIONS

Taiwanese Office Action and Search Report for Application No. 106121555, dated Feb. 2, 2018.

*Primary Examiner* — Hai L Nguyen
(74) *Attorney, Agent, or Firm* — Birch, Stewart, Kolasch & Birch, LLP

(57) ABSTRACT

A power-on control circuit controlling a first output switch and a second output switch is provided. A detecting circuit detects a first voltage to generate a detection signal to a first node. A switching circuit receives the first voltage and a second voltage and transmits the first or second voltage to a second node according to the voltage level of the first node. A setting circuit generates a feedback signal to the first node according to a voltage level of the second node. When the first voltage reaches a first pre-determined value and the second voltage has not reached a second pre-determined value, the switching circuit transmits the second voltage to the second node. When the second voltage reaches the second pre-determined value, the switching circuit transmits the first voltage to the second node.

20 Claims, 6 Drawing Sheets

(56) References Cited

U.S. PATENT DOCUMENTS

| | | | |
|---|---|---|---|
| 8,963,590 B2* | 2/2015 | Guimont | H03K 17/223 327/142 |
| 2005/0195000 A1 | 9/2005 | Parker et al. | |
| 2007/0103215 A1 | 5/2007 | Boerstler et al. | |

* cited by examiner

POWER-ON CONTROL CIRCUIT

BACKGROUND OF THE INVENTION

Field of the Invention

The invention relates to a control circuit, and more particularly to a control circuit configured to control a pad.

Description of the Related Art

With the ongoing development of various technologies, there has been a marked increase in the types and functions of electronic devices available on the market. Generally speaking, there are many integrated circuits (ICs) disposed in each electronic device. Each IC may receive many voltages, which are quite different from each other. When one of these voltages fails to reach a target value, the IC that runs on this voltage may start to work abnormally and generate errors.

BRIEF SUMMARY OF THE INVENTION

In accordance with an embodiment, a power-on control circuit controls a first output switch and a second output switch and comprises a detecting circuit, a switching circuit, and a setting circuit. The detecting circuit detects a first voltage to generate a detection signal to a first node. The switching circuit receives the first voltage and a second voltage and transmits the first or second voltage to a second node according to the voltage level of the first node. The setting circuit is coupled to the first and second nodes, controls the first and second output switches, and generates a feedback signal to the first node according to a voltage level of the second node. When the first voltage reaches a first pre-determined value and the second voltage has not reached a second pre-determined value, the switching circuit transmits the second voltage to the second node according to the detection signal. When the first voltage reaches the first pre-determined value and the second voltage reaches the second pre-determined value, the switching circuit transmits the first voltage to the second node according to the feedback signal.

In accordance with another embodiment, a control circuit controls the voltage level of a pad and comprises a first output switch, a second output switch, a core circuit, and a power-on control circuit. The first output switch is configured to provide voltage from a first voltage source to the pad. The second output switch is configured to provide a ground voltage to the pad. The core circuit is coupled to the first voltage source and a second voltage source. During a normal period, the core circuit controls the first and second output switches. The power-on control circuit is coupled to the first and second voltage sources. During an initial period, the power-on control circuit controls the first and second output switches. The voltages provided by the first and second voltage sources are gradually increased during the initial period. The power-on control circuit comprises a detecting circuit, a switching circuit and a setting circuit. The detecting circuit detects the voltage provided by the first voltage source to generate a detection signal to a first node. The switching circuit is coupled to the first and second voltage sources and transmits the voltage provided by the first or second voltage sources to a second node according to the signal of the first node. The setting circuit is coupled to the first and second nodes, controls the first and second output switches according to a voltage level of the second node, and generates a feedback signal to the first node. When the voltage provided by the first voltage source reaches a first pre-determined value and the voltage provided by the second voltage source has not reached a second pre-determined value, the switching circuit transmits the voltage provided by the second voltage source to the second node according to the detection signal. When the voltage provided by the first voltage source reaches the first pre-determined value and the voltage provided by the second voltage source reaches the second pre-determined value, the switching circuit transmits the voltage provided by the first voltage source to the second node according to the feedback signal.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
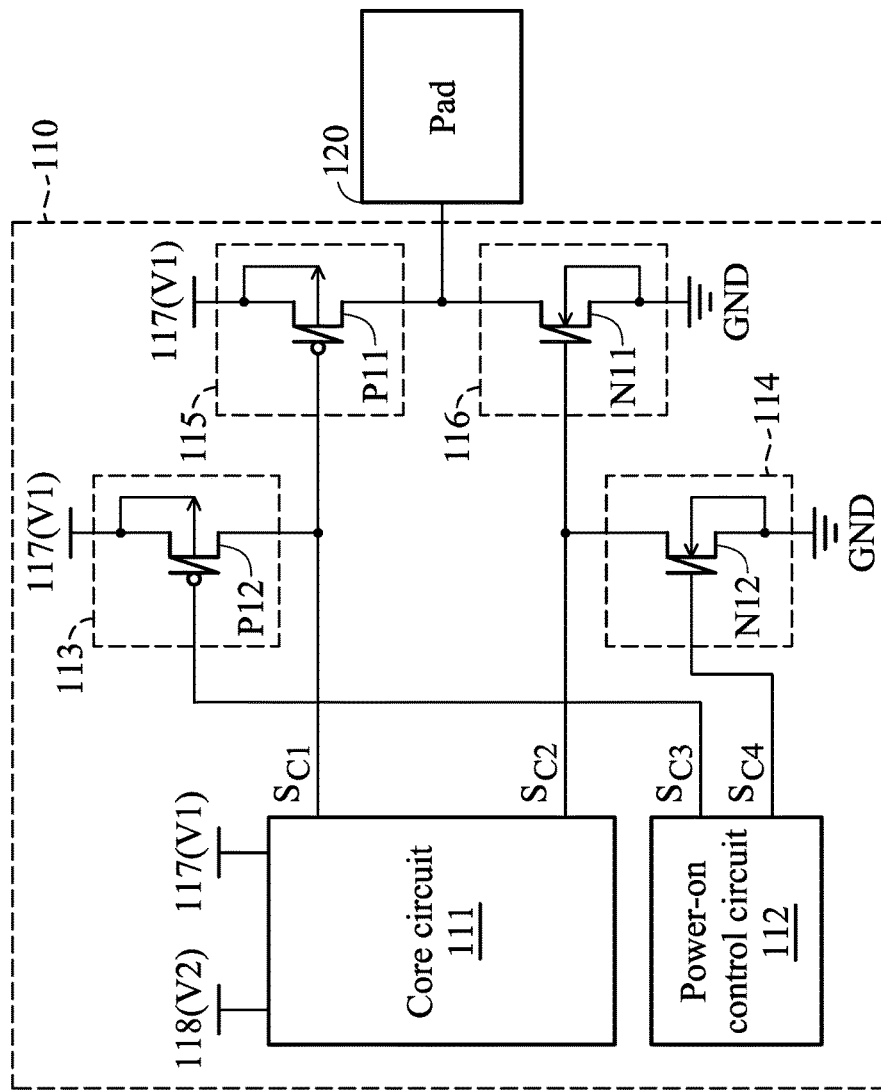
FIG. 1 is a schematic diagram of an exemplary embodiment of a control circuit, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a control circuit, according to various aspects of the present disclosure. The control circuit 110 is coupled to a pad 120 and controls the voltage level of the pad 120. In this embodiment, the control circuit 110 comprises a core circuit 111, a power-on control circuit 112, control switches 113 and 114, and output switches 115 and 116.

The core circuit 111 is coupled to voltage sources 117 and 118 to receive voltages V1 and V2. In a normal period, the voltage V1 is greater than a first pre-determined value, and the voltage V2 is greater than a second pre-determined value. At this period, the core circuit 111 generates control signals $S_{C1}$ and $S_{C2}$ according to the voltages V1 and V2. The control signal $S_{C1}$ is utilized to turn on or turn off the output switch 115. The control signal $S_{C2}$ is utilized to turn on or turn off the output switch 116. In this embodiment, when the output switch 115 is turned, the output switch 116 is turned off. Therefore, the output switch 115 provides the voltage V1 to the pad 120. However, when the output switch 116 is turned on, the output switch 115 is turned off. At this time, the output switch 116 provides the ground level GND to the pad 120.

However, during an initial period, the voltage source 117 starts providing the voltage V1, and the voltage source 118 starts providing the voltage V2. During the initial period, the voltages V1 and V2 are gradually increased from an initial level, such as 0V. When the voltage V1 has not reached a first pre-determined value (e.g. 0.7V) and/or the voltage V2 has not reached a second pre-determined value (e.g. 0.9V), if the core circuit 111 utilizes the voltages V1 and V2 to generate the control signals $S_{C1}$ and $S_{C2}$, the core circuit 111 may turn on both the output switches 115 and 116 such that a leakage current passes through the output switches 115 and 116. In this embodiment, during the initial period, the power-on control circuit 112 controls the output switches 115 and 116 to avoid that the output switches 115 and 116 are turned on simultaneously.

As shown in FIG. 1, the power-on control circuit 112 generates control signals $S_{C3}$ and $S_{C4}$ to turn off the output switches 115 and 116. In this embodiment, the power-on control circuit 112 turns off the output switches 115 and 116 via the control switches 113 and 114, but the disclosure is not limited thereto. In other embodiments, the power-on control circuit 112 may directly control the output switches 115 and 116 to avoid the output switches 115 and 116 are turned on simultaneously.

However, when the voltage V1 is greater than the first pre-determined value and the voltage V2 is greater than the second pre-determined value, the core circuit 111 controls the output switches 115 and 116. In this embodiment, the output switch 115 is coupled to the voltage source 117 to receive the voltage V1 and provides the voltage V1 to the pad 120 according to the control signal $S_{C1}$. Additionally, the output switch 116 receives the ground voltage GND and provides the ground voltage GND to the pad 120 according to the control signal $S_{C2}$.

In one embodiment, the output switch 115 is a P-type transistor P11. The gate of the P-type transistor P11 receives the control signal $S_{C1}$ and is coupled to the control switch 113. The source of the P-type transistor P11 is coupled to the voltage source 117 to receive the voltage V1. The drain of the P-type transistor P11 is coupled to the pad 120. In the disclosure, the circuit structure of the output switch 115 is not limited. Any circuit can serve as the output switch 115, as long as the circuit is capable of providing a high level to the pad 120 according to the control signal $S_{C1}$. In other embodiments, the output switch 115 is an N-type transistor.

Furthermore, the output switch 116 is an N-type transistor N11. As shown in FIG. 1, the gate of the N-type transistor N11 receives the control signal $S_{C2}$ and is coupled to the control switch 114. The source of the N-type transistor N11 receives the ground voltage GND. The drain of the N-type transistor N11 is coupled to the pad 120. In the disclosure, the circuit structure of the output switch 116 is not limited. Any circuit can serve as the output switch 116, as long as the circuit is capable of providing a low level to the pad 120 according to the control signal $S_{C2}$. In other embodiments, the output switch 116 is a P-type transistor.

In this embodiment, the control switch 113 is a P-type transistor P12. The gate of the P-type transistor P12 receives the control signal $S_{C3}$. The source of the P-type transistor P12 is coupled to the voltage source 117 to receive the voltage V1. The drain of the P-type transistor P12 is coupled to the gate of the P-type transistor P11. In the disclosure, the circuit structure of the control switch 113 is not limited. Any circuit can serve as the control switch 113, as long as the circuit is capable of turning on or off the output switch 115 according to the control signal $S_{C3}$. In other embodiments, the control switch 113 is an N-type transistor.

In this embodiment, the control switch 114 is an N-type transistor N12. The gate of the N-type transistor N12 receives the control signal $S_{C4}$. The source of the N-type transistor N12 receives the ground voltage GND. The drain of the N-type transistor N12 is coupled to the gate of the N-type transistor N11. In the disclosure, the circuit structure of the control switch 114 is not limited. Any circuit can serve as the control switch 114, as long as the circuit is capable of turning on or off the output switch 116 according to the control signal $S_{C4}$. In other embodiments, the control switch 114 is a P-type transistor.

In an initial period, since the voltage V1 is not greater than the first pre-determined value and/or voltage V2 is not greater than the second pre-determined value, the power-on control circuit 112 turns on the control switches 113 and 114 to turn off the output switches 115 and 116. In a normal period, voltage V1 is greater than the first pre-determined value and the voltage V2 is greater than the second pre-determined value, the core circuit 111 controls the output switches 115 and 116. At this period, the power-on control circuit 112 may turn off the control switches 113 and 114.

In one embodiment, during the normal period, the voltage source 117 continuously increases the voltage V1 until the voltage V1 reaches a first target value. During the normal period, the voltage source 118 continuously increases the voltage V2 until the voltage V2 reaches a second target value. When the voltage V1 reaches the first target value, the voltage V1 is provided as an input/output power. When the voltage V2 reaches the second target value, the voltage V2 is provided as a core power. In this embodiment, the first target value is higher than the second target value. In one embodiment, the first target value is approximately 3.3V, and the second target value is approximately 1.8V.

Figure 2:
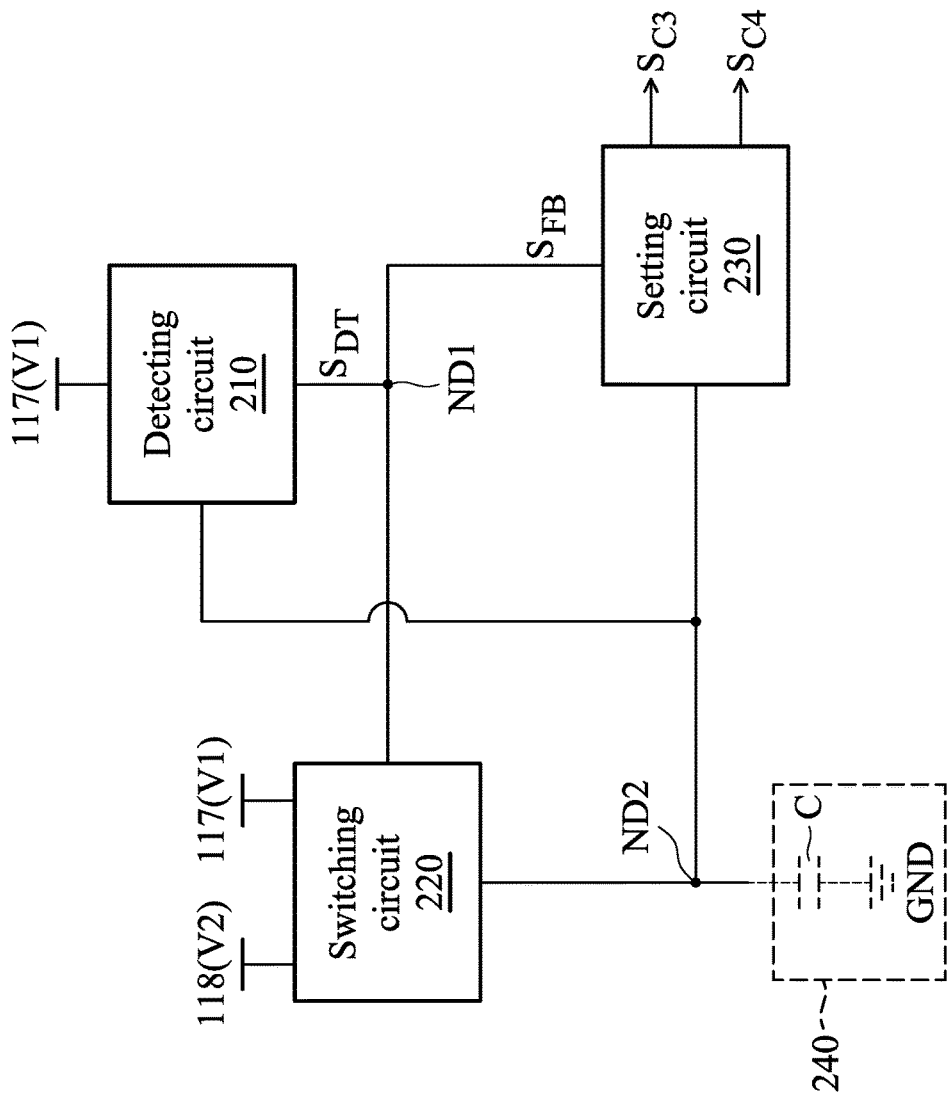
FIG. 2 is a schematic diagram of an exemplary embodiment of a power-on control circuit, according to various aspects of the present disclosure.

FIG. 2 is a schematic diagram of an exemplary embodiment of a power-on control circuit, according to various aspects of the present disclosure. As shown in FIG. 2, the power-on control circuit 200 comprises a detecting circuit 210, a switching circuit 220 and a setting circuit 230. In this embodiment, the detecting circuit 210 is coupled to the node ND2 and detects the voltage V1 provided by the voltage source 117 to generate a detection signal $S_{DT}$ to the node ND1. For example, during the initial period, the voltage source 117 gradually increases the voltage V1. When the voltage V1 reaches a first pre-determined value (e.g. 0.7V), the detecting circuit 210 transmits the voltage V1 to the node ND1. At this time, the node ND1 may have a high level. On the contrary, when the voltage V1 has not reached the first pre-determined value, the detecting circuit 210 does not transmit the voltage V1 to the node ND1. In the present disclosure, the circuit structure of the detecting circuit 210 is not limited thereto. Any circuit can serve as the detecting circuit 210, as long as the circuit is capable of detecting the voltage V1.

The switching circuit 220 is coupled to the voltage sources 117 and 118 to receive the voltages V1 and V2. The switching circuit 220 transmits the voltage V1 or V2 to the node ND2 according to the signal of the node ND1. In this embodiment, when the node ND1 has a high level, the switching circuit 220 transmits the voltage V2 to the node ND2. However, when the node ND1 has a low level, the switching circuit 220 transmits the voltage V1 to the node ND2. The circuit structure of the switching circuit 220 is not limited in the invention. Any circuit can serve as the switching circuit 220, as long as the circuit is capable of providing the voltage V1 or V2 to the node ND2 according to the voltage level of the node ND1.

The setting circuit 230 is coupled to the nodes ND1 and ND2 and generates a feedback signal $S_{FB}$ to the node ND1 according to the voltage level of the node ND2. In this embodiment, when the switching circuit 220 transmits the voltage V2 to the node ND2, since the voltage V2 has not reached a second pre-determined value (e.g. 0.9V), the voltage level of the node ND2 is a low level. At this time, the setting circuit 230 outputs the feedback signal $S_{FB}$ which as a high level to the node ND1. In one embodiment, the voltage level of the ND2 is opposite to the voltage level of the feedback signal $S_{FB}$. For example, when the voltage level of the ND2 is a high level, the feedback signal $S_{FB}$ is at a low level. When the voltage level of the ND2 is a low level, the feedback signal $S_{FB}$ is at a high level.

Since the node ND1 has a high level, the switching circuit 220 still outputs the voltage V2 to the node ND2. However, when the voltage V2 reaches a second pre-determined value, the voltage level of the node ND2 is changed from a low level to a high level. Therefore, the setting circuit 230 outputs the feedback signal $S_{FB}$ which has a low level to the node ND1. Since the voltage level of the node ND1 is the low level, the switching circuit 220 outputs the voltage V1 to the node ND2. Therefore, the voltage level of the node ND2 is still at the high level such that the voltage level of the node ND1 is the low level.

In this embodiment, when the voltage level of the node ND2 is the low level, the setting circuit 230 outputs the control signal $S_{C3}$ which has a low level and the control signal $S_{C4}$ which has a high level. Therefore, the control switches 113 and 114 shown in FIG. 1 are turned on such that the output switches 115 and 116 are turned off. However, when the voltage level of the node ND2 is the high level, the setting circuit 230 outputs the control signal $S_{C3}$ which has a high level and the control signal $S_{C4}$ which has a low level. Therefore, the control switches 113 and 114 shown in FIG. 1 are turned off. At this time, the output switches 115 and 116 are controlled by the core circuit 111.

In another embodiment, the power-on control circuit 200 further comprises a setting circuit 240. The setting circuit 240 is configured to set an initial level of the node ND2. In one embodiment, the setting circuit 240 is a capacitor C. The capacitor C is coupled to the node ND2 to set the initial level of the node ND2 at a low level. In this embodiment, the initial level of the node ND2 is equal to the ground voltage GND.

Figure 3A:
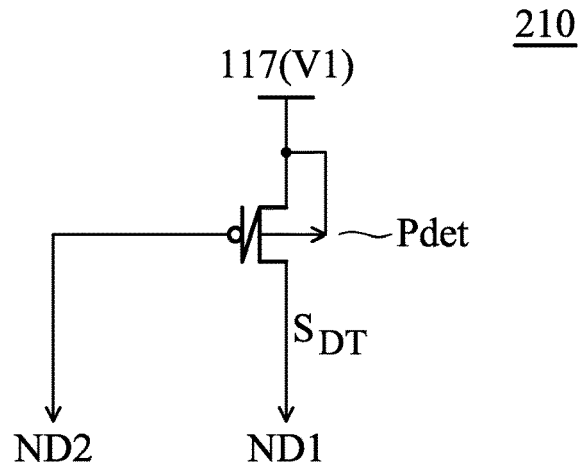
FIG. 3A is a schematic diagram of an exemplary embodiment of a detecting circuit, according to various aspects of the present disclosure.

FIG. 3A is a schematic diagram of an exemplary embodiment of a detecting circuit, according to various aspects of the present disclosure. In this embodiment, the detecting circuit 210 is a P-type transistor Pdet. The source of the P-type transistor Pdet is coupled to the voltage source 117 to receive the voltage V1. The drain of the P-type transistor Pdet outputs the detection signal $S_{DT}$ and is coupled to the node ND1. The gate of the P-type transistor Pdet is coupled to the node ND2. When the voltage level of the node ND2 is a low level and the voltage V2 provided by the voltage source 117 reaches the first pre-determined value, the P-type transistor Pdet is turned on to transmit the voltage V1 generated by the voltage source 117 to the node ND1. At this time, the voltage level of the node ND1 is a high level.

Figure 3B:
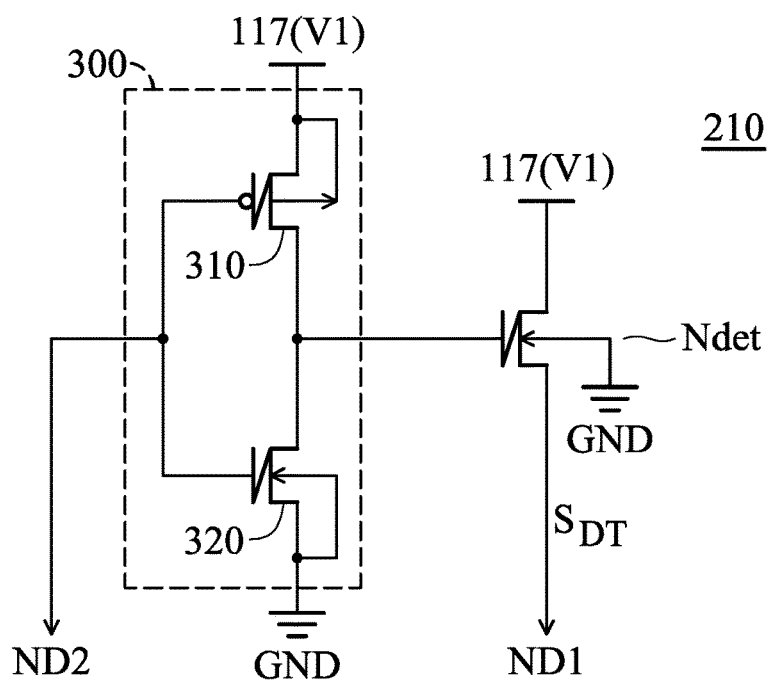
FIG. 3B is a schematic diagram of another exemplary embodiment of the detecting circuit, according to various aspects of the present disclosure.

FIG. 3B is a schematic diagram of another exemplary embodiment of the detecting circuit, according to various aspects of the present disclosure. In this embodiment, the detecting circuit 210 comprises an N-type transistor Ndet and an inverter 300. The drain of the N-type transistor Ndet is coupled to the voltage source 117 to receive the voltage V1. The source of the N-type transistor Ndet is coupled to the node ND1. The gate of the N-type transistor Ndet is coupled to the output terminal of the inverter 300.

The input terminal of the inverter 300 is coupled to the node ND2. The output terminal of the inverter 300 is coupled to the gate of the N-type transistor Ndet. In this embodiment, the inverter 300 comprises a P-type transistor 310 and an N-type transistor 320. The gate of the P-type transistor 310 is coupled to the gate of the N-type transistor 320 to serve as the input terminal of the inverter 300. The source of the P-type transistor 310 receives the voltage V1 of the voltage source 117. The drain of the P-type transistor 310 is coupled to the drain of the N-type transistor 320 and the gate of the N-type transistor Ndet. The source of the N-type transistor 320 receives the ground voltage GND.

When the voltage level of the node ND2 is a low level, the P-type transistor 310 is turned on to turn on the N-type transistor Ndet. Therefore, the voltage level of the node ND1 is equal to the voltage V1 of the voltage source 117. When the voltage level of the node ND2 is a high level, the N-type transistor 320 is turned on to turn off the N-type transistor Ndet. Therefore, the N-type transistor Ndet does not transmit the voltage V1 provided by the voltage source 117 to the node ND1.

Figure 4A:
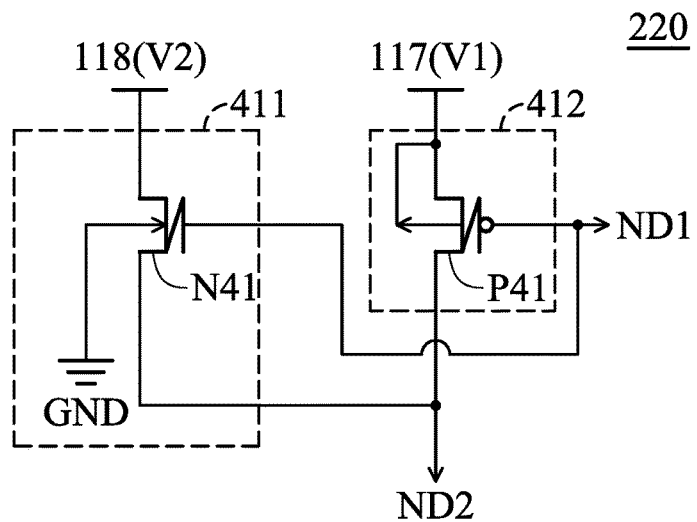
FIG. 4A is a schematic diagram of an exemplary embodiment of a switching circuit, according to various aspects of the present disclosure.

FIG. 4A is a schematic diagram of an exemplary embodiment of a switching circuit, according to various aspects of the present disclosure. In this embodiment, the switching circuit 220 comprises switches 411 and 412. The switch 411 is coupled to the voltage source 118 to receive the voltage V2 and transmits the voltage V2 to the node ND2 according to the voltage level of the node ND1. For example, when the voltage level of the node ND1 is a low level, the switch 411 does not transmit the voltage V2 to the node ND2. When voltage level of the node ND1 is a high level, the switch 411 transmits the voltage V2 to the node ND2. In this embodiment, the switch 411 is an N-type transistor N41. The drain of the N-type transistor N41 is coupled to the voltage source 118 to receive the voltage V2. The source of the N-type transistor N41 is coupled to the node ND2. The gate of the N-type transistor N41 is coupled to the node ND1.

The switch 412 is coupled to the voltage source 117 to receive the voltage V1 and transmits the voltage V1 to the node ND2 according to the voltage level of the node ND1. For example, when the voltage level of the node ND1 is a low level, the switch 412 transmits the voltage V1 to the node ND2. When voltage level of the node ND1 is a high level, the switch 412 does not transmit the voltage V1 to the node ND2. In this embodiment, the switch 412 is a P-type transistor P41. The source of the P-type transistor P41 receives the voltage V1 of the voltage source 117. The drain of the P-type transistor P41 is coupled to the node ND2. The gate of the P-type transistor P41 is coupled to the node ND1.

Figure 4B:
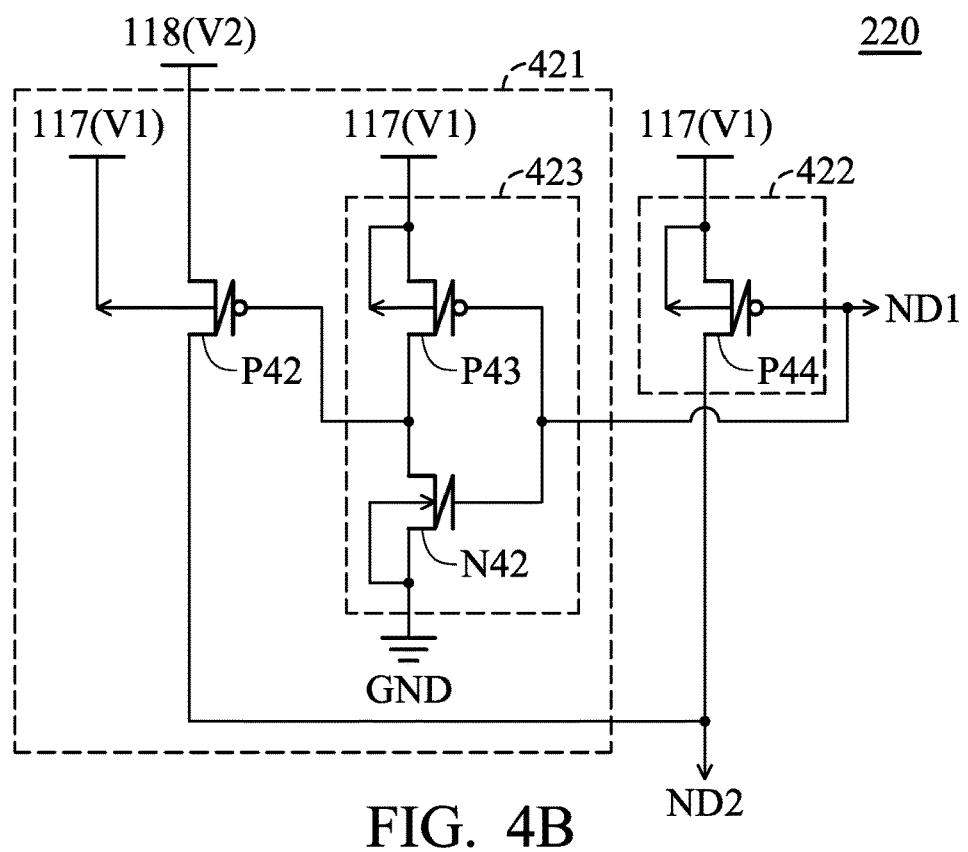
FIG. 4B is a schematic diagram of another exemplary embodiment of the switching circuit, according to various aspects of the present disclosure.

FIG. 4B is a schematic diagram of another exemplary embodiment of the switching circuit, according to various aspects of the present disclosure. In this embodiment, the switching circuit 220 comprises switches 421 and 422. The switch 421 receives the voltage V2 provided by the voltage source 118 and outputs the voltage V2 provided by the voltage source 118 to the node ND2. For example, when the voltage level of the node ND1 is a low level, the switch 421 does not output the voltage V2 provided by the voltage source 118 to the node. When the voltage level of the node ND1 is a high level, the switch 421 outputs the voltage V2 provided by the voltage source 118 to the node ND2.

As shown in FIG. 4B, the switch 421 comprises a P-type transistor P42 and an inverter 423. The source of the P-type transistor P42 is coupled to the voltage source 118 to receive the voltage V2. The drain of the P-type transistor P42 is coupled to the node ND2. The gate of the P-type transistor P42 is coupled to the output terminal of the inverter 423. The input terminal of the inverter 423 is coupled to the node ND1. In this embodiment, the inverter 423 comprises a P-type transistor P43 and an N-type transistor N42. The source of the P-type transistor P43 receives the voltage V1 of the voltage source 117. The drain of the P-type transistor P43 is coupled to the gate of the P-type transistor P42. The gate of the P-type transistor P43 is coupled to the node ND1. The drain of the N-type transistor N42 is coupled to the gate of the P-type transistor P42. The source of the N-type transistor N42 receives the ground voltage GND. The gate of the N-type transistor N42 is coupled to the node ND1.

In this embodiment, the switch 422 receives the voltage V1 generated by the voltage source 117 and transmits the voltage V1 to the node ND2 according to the voltage level of the node ND1. For example, when the voltage level of the node ND1 is a low level, the switch 422 transmits the voltage V1 to the node ND2. When the voltage level of the node ND1 is a high level, the switch 422 does not transmit the voltage V1 to the node ND2. In one embodiment, the switch 422 is a P-type transistor P44. The source of the P-type transistor P44 is coupled to the voltage source 117 to receive the voltage V1. The drain of the P-type transistor P44 is coupled to the node ND2. The gate of the P-type transistor P44 is coupled to the node ND1.

Figure 4C:
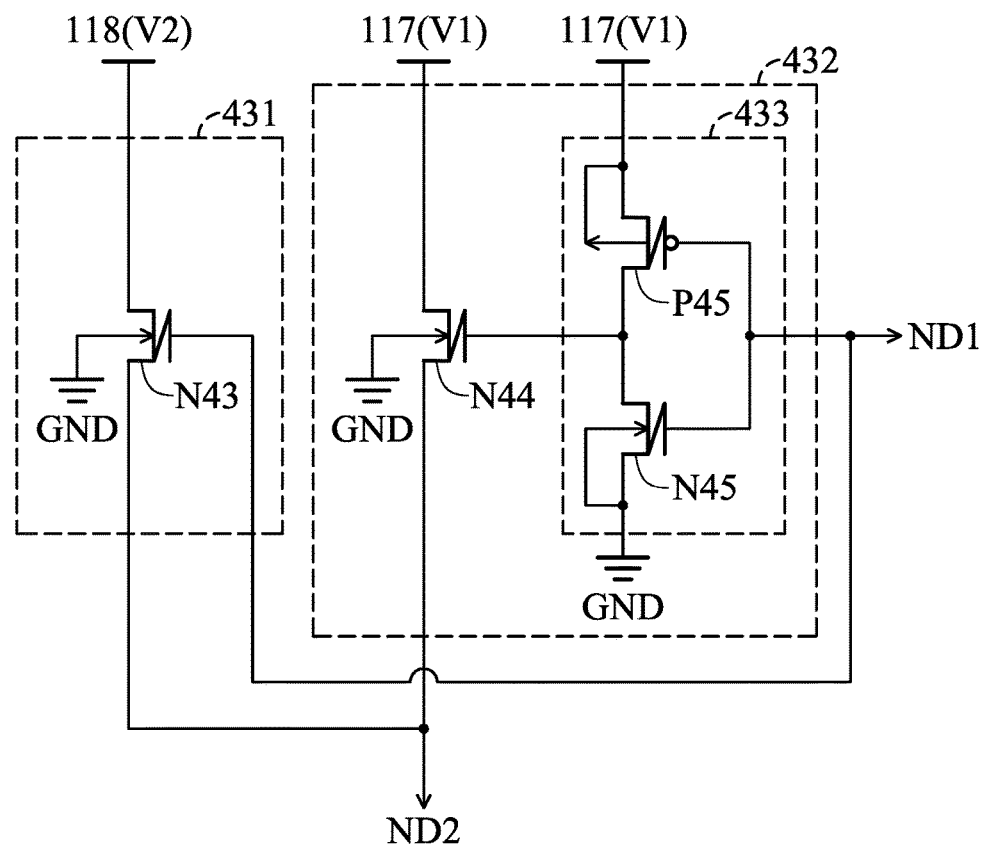
FIG. 4C is a schematic diagram of another exemplary embodiment of the switching circuit, according to various aspects of the present disclosure.

FIG. 4C is a schematic diagram of another exemplary embodiment of the switching circuit, according to various aspects of the present disclosure. In this embodiment, the switching circuit 220 comprises switches 431 and 432. The switch 431 receives the voltage V2 generated by the voltage source 118 and transmits the voltage V2 to the node ND2 according to the voltage level of the node ND1. For example, when the voltage level of the node ND1 is a low level, the switch 431 does not transmit the voltage V2 to the node ND2. When the voltage level of the node ND1 is a high level, the switch 431 transmits the voltage V2 to the node ND2. In this embodiment, the switch 431 comprises an N-type transistor N43. The drain of the N-type transistor N43 receives the voltage V2 generated by the voltage source 118. The source of the N-type transistor N43 is coupled to the node ND2. The gate of the N-type transistor N43 is coupled to the node ND1.

In this embodiment, the switch 432 receives the voltage V1 of the voltage source 117 and transmits the voltage V1 of the voltage source 117 to the node ND2 according to the voltage level of the node ND1. For example, when the voltage level of the node ND1 is a low level, the switch 432 transmits the voltage V1 of the voltage source 117 to the node ND2. When the voltage level of the node ND1 is a high level, the switch 432 does not transmit the voltage V1 of the voltage source 117 to the node ND2. As shown in FIG. 4C, the switch 432 comprises an N-type transistor N44 and an inverter 433.

The drain of the N-type transistor N44 receives the voltage V1 of the voltage source 117. The source of the N-type transistor N44 is coupled to the node ND2. The gate of the N-type transistor N44 is coupled to the output terminal of the inverter 432. The input terminal of the inverter 432 is coupled to the node ND1. In this embodiment, the inverter 432 comprises a P-type transistor P45 and an N-type transistor N45. The source of the P-type transistor P45 receives the voltage V1 of the voltage source 117. The drain of the P-type transistor P45 is coupled to the gate of the N-type transistor N44. The gate of the P-type transistor P45 is coupled to the node ND1. The drain of the N-type transistor N45 is coupled to the gate of the N-type transistor N44. The source of the N-type transistor N45 receives the ground voltage GND. The gate of the N-type transistor N45 is coupled to the node ND1.

Figure 5:
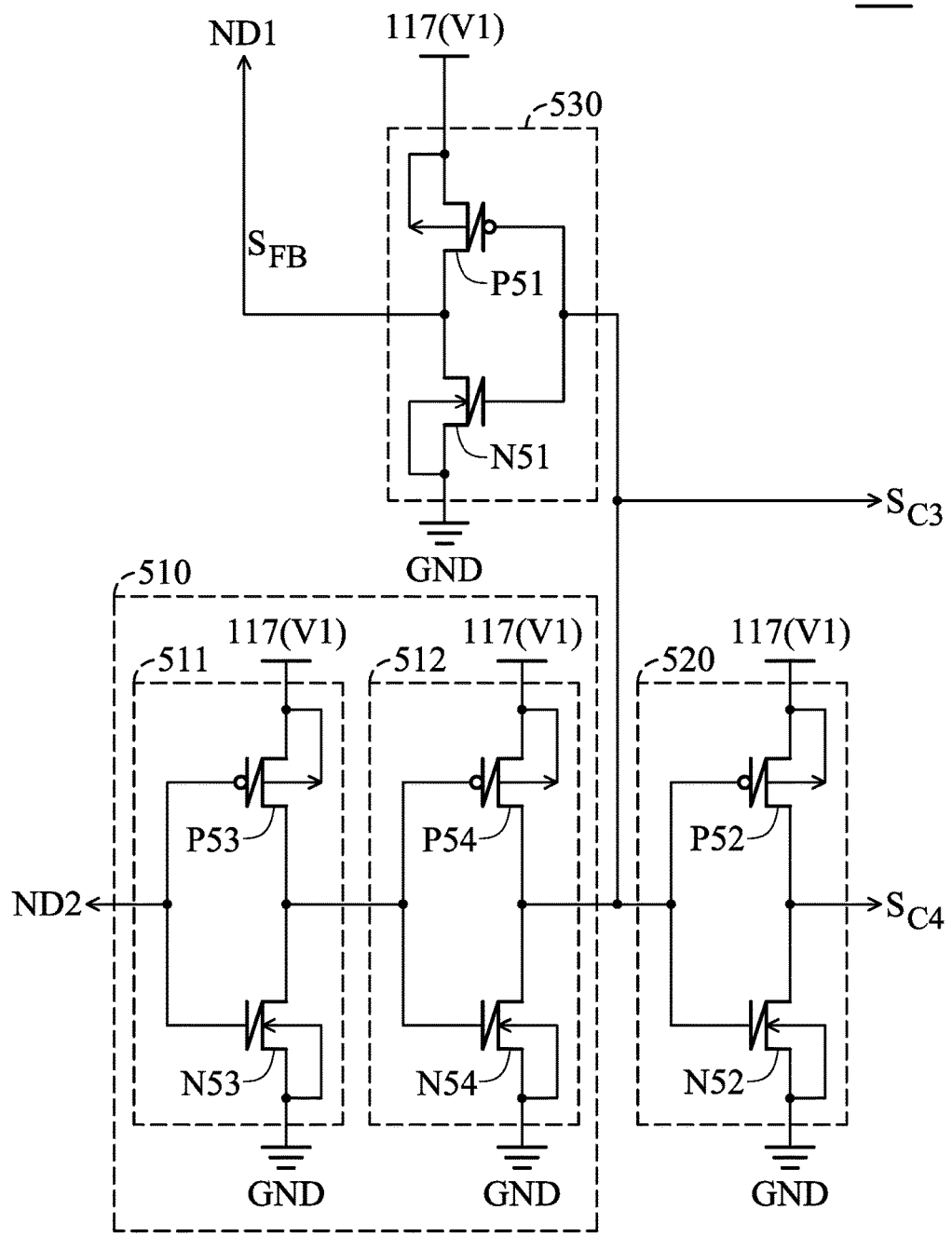
FIG. 5 is a schematic diagram of another exemplary embodiment of a setting circuit, according to various aspects of the present disclosure.

FIG. 5 is a schematic diagram of another exemplary embodiment of a setting circuit, according to various aspects of the present disclosure. The setting circuit 230 generates the feedback signal $S_{FB}$ to the node ND1 according to the voltage level of the node ND2 and generates the control signals $S_{C3}$ and $S_{C4}$. For example, when the voltage level of the node ND2 is a low level, the setting circuit 230 generates the control signal $S_{C3}$ which has a low level and the setting circuit 230 generates the control signal $S_{C4}$ which has a high level. At this time, the feedback signal $S_{FB}$ is at a high level. When the voltage level of the node ND2 is a high level, the setting circuit 230 generates the control signal $S_{C3}$ which has a high level and the setting circuit 230 generates the control signal $S_{C4}$ which has a low level. At this time, the feedback signal $S_{FB}$ is at a low level.

In this embodiment, the setting circuit 230 comprises a buffer 510 and inverters 520 and 530. The buffer 510 is coupled to the node ND2 and outputs the control signals $S_{C3}$ and $S_{C4}$ to control the output switches 115 and 116 shown in FIG. 1. In the present disclosure, the circuit structure of the buffer 510 is not limited. In one embodiment, the buffer 510 comprises inverters 511 and 512. The input terminal of the inverter 511 is coupled to the node ND2. The output terminal of the inverter 511 is coupled to the input terminal of the inverter 512. The output terminal of the inverter 512 is coupled to the input terminals of the inverters 520 and 530 and outputs the control signal $S_{C3}$. In this embodiment, the inverter 511 comprises a P-type transistor P53 and an N-type transistor N53. Furthermore, the inverter 512 comprises a P-type transistor P54 and an N-type transistor N54.

The source of the P-type transistor P53 receives the voltage V1 provided by the voltage source 117. The drain of the P-type transistor P53 is coupled to the input terminal of the inverter 512. The gate of the P-type transistor P53 is coupled to the node ND2. The drain of the N-type transistor N53 is coupled to the drain of the P-type transistor P53. The source of the N-type transistor N53 receives the ground voltage GND. The gate of the N-type transistor N53 is coupled to the gate of the P-type transistor P53. The source of the P-type transistor P54 receives the voltage V1 of the voltage source 117. The drain of the P-type transistor P54 is coupled to the input terminals of the inverters 520 and 530. The gate of the P-type transistor P54 is coupled to the drains of the P-type transistor P53 and the N-type transistor N53. The drain of the N-type transistor N54 is coupled to the drain of the P-type transistor P54. The source of the N-type transistor N54 receives the ground voltage GND. The gate of the N-type transistor N54 is coupled to the gate of the P-type transistor P54.

The input terminal of the inverter 520 receives the control signal $S_{C3}$. The output terminal of the inverter 520 outputs the control signal $S_{C4}$. The inverter 520 generates the control signal $S_{C4}$ according to the control signal $S_{C3}$ to control the output switch 116 shown in FIG. 1. In this embodiment, when the voltage level of the control signal $S_{C3}$ is a high level, the voltage level of the control signal $S_{C4}$ is a low level. When the voltage level of the control signal $S_{C3}$ is a low level, the voltage level of the control signal $S_{C4}$ is a high level. The circuit structure of the inverter 520 is not limited in the present invention. In one embodiment, the inverter 520 comprises a P-type transistor P52 and an N-type transistor N52. The source of the P-type transistor P52 receives the voltage V1 generated by the voltage source 117. The drain of the P-type transistor P52 is coupled to the drain of the N-type transistor N52 to output the control signal $S_{C4}$. The gate of the P-type transistor P52 is coupled to the gate of the N-type transistor N52 and the drain of the P-type transistor P54. The source of the N-type transistor N52 receives the ground voltage GND.

The input terminal of the inverter 530 receives the control signal $S_{C3}$. The output terminal of the inverter 530 outputs the feedback signal $S_{FB}$. In this embodiment, when the control signal $S_{C3}$ is at a high level, the feedback signal $S_{FB}$ is at a low level. When the control signal $S_{C3}$ is at a low level, the feedback signal $S_{FB}$ is at a high level. As shown in FIG. 5, the inverter 530 comprises a P-type transistor P51 and an N-type transistor N51. The source of the P-type transistor P51 receives the voltage V1 provided by the voltage source 117. The drain of the P-type transistor P51 is coupled to the node ND1. The gate of the P-type transistor P51 is coupled to the gate of the P-type transistor P52. The drain of the N-type transistor N51 is coupled to the node ND1. The source of the N-type transistor N51 receives the ground voltage GND. The gate of the N-type transistor N51 is coupled to the gate of the P-type transistor P51.

When the voltage V2 provided by the voltage source 118 has not reached a second pre-determined value, the level of the node ND2 is a low level. Therefore, the setting circuit 230 outputs the feedback signal $S_{FB}$, which has a high level. At this time, the control signal $S_{C3}$ is at a low level and the control signal $S_{C4}$ is at a high level. However, when the voltage V2 provided by the voltage source 118 reaches the second pre-determined value, the level of the node ND2 is a high level. Therefore, the setting circuit 230 outputs the feedback signal $S_{FB}$ having a low level. At this time, the control signal $S_{C3}$ is at a high level, and the control signal $S_{C4}$ is at a low level.

Taking FIG. 1 as an example, when the voltage V2 provided by the voltage source 118 has not reached a second pre-determined value, the power-on control circuit 112 utilizes the control signals $S_{C3}$ and $S_{C4}$ to turn off the output switches 115 and 116 to avoid a leakage current passing through the output switches 115 and 116. When the voltage V2 provided by the voltage source 118 reaches the second pre-determined value, the power-on control circuit 112 does not control the output switches 115 and 116. At this time, the voltage V1 provided by the voltage source 117 and the voltage V2 provided by the voltage source 118 are enough to make the core circuit 111 work normally. Therefore, the core circuit 111 controls the output switches 115 and 116 to adjust the voltage level of the pad 120.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A power-on control circuit controlling a first output switch and a second output switch and comprising:
   a detecting circuit detecting a first voltage to generate a detection signal to a first node;
   a switching circuit receiving the first voltage and a second voltage and transmitting the first or second voltage to a second node according to a voltage level of the first node; and
   a setting circuit coupled to the first and second nodes, controlling the first and second output switches and generating a feedback signal to the first node according to a voltage level of the second node,
   wherein when the first voltage reaches a first pre-determined value and the second voltage has not reached a second pre-determined value, the switching circuit transmits the second voltage to the second node according to the detection signal, and
   wherein when the first voltage reaches the first pre-determined value and the second voltage reaches the second pre-determined value, the switching circuit transmits the first voltage to the second node according to the feedback signal.

2. The power-on control circuit as claimed in claim 1, wherein the detecting circuit comprises:
   a P-type transistor comprising a source, a drain and a gate, wherein the source of the P-type transistor receives the first voltage, the drain of the P-type transistor is coupled to the first node, and the gate of the P-type transistor is coupled to the second node.

3. The power-on control circuit as claimed in claim 1, wherein the detecting circuit comprises:
   an inverter comprising an input terminal and an output terminal, wherein the input terminal is coupled to the second node; and
   an N-type transistor comprising a drain, a source and a gate, wherein the drain of the N-type transistor receives the first voltage, the source of the N-type transistor is coupled to the first node, and the gate of the N-type transistor is coupled to the output terminal of the inverter.

4. The power-on control circuit as claimed in claim 1, wherein the switching circuit comprises:
   a P-type transistor comprising a first source, a first drain and a first gate, wherein the first source of the P-type transistor receives the first voltage, the first drain of the P-type transistor is coupled to the second node, and the first gate of the P-type transistor is coupled to the first node; and
   an N-type transistor comprising a second drain, a second source, and a second gate, wherein the second drain of the N-type transistor receives the second voltage, the source of the N-type transistor is coupled to the second node, and the second gate of the N-type transistor is coupled to the first node.

5. The power-on control circuit as claimed in claim 1, wherein the switching circuit comprises:

a first P-type transistor comprising a first source, a first drain and a first gate, wherein the first source of the first P-type transistor receives the first voltage, the first drain of the first P-type transistor is coupled to the second node, and the first gate of the first P-type transistor is coupled to the first node;

an inverter comprising an input terminal coupled to the first node; and a second P-type transistor comprising a second source, a second drain and a second gate, wherein the second source of the second P-type transistor receives the second voltage, the second drain of the second P-type transistor is coupled to the second node, and the second gate of the second P-type transistor is coupled to an output terminal of the inverter.

6. The power-on control circuit as claimed in claim 1, wherein the switching circuit comprising:

an inverter comprising an input terminal coupled to the first node;

a first N-type transistor comprising a first drain, a first source and a first gate, wherein the first drain of the first N-type transistor receives the first voltage, the first source of the first N-type transistor is coupled to the second node, and the first gate of the first N-type transistor is coupled to an output terminal of the inverter; and a second N-type transistor comprising a second drain, a second source and a second gate, wherein the second drain of the second N-type transistor receives the second voltage, the second source of the second N-type transistor is coupled to the second node, and the second gate of the second N-type transistor is coupled to the first node.

7. The power-on control circuit as claimed in claim 1, wherein the setting circuit comprises:

a buffer coupled to the second node and outputting a first control signal to control the first output switch;

a first inverter generating a second control signal to control the second output switch according to the first control signal; and a second inverter generating the feedback signal according to the first control signal.

8. The power-on control circuit as claimed in claim 7, wherein the buffer comprises:

a third inverter comprising an input terminal coupled to the second node; and a fourth inverter comprising an input terminal and an output terminal, wherein the input terminal of the fourth inverter is coupled to an output terminal of the third inverter, and the output terminal of the fourth inverter outputs the first control signal.

9. The power-on control circuit as claimed in claim 7, wherein during an initial period, the first control signal is at a first level, during a normal period, the first control signal is at a second level different from the first level.

10. The power-on control circuit as claimed in claim 1, further comprising:

a capacitor coupled to the second node to set the voltage level of the second node at an initial level.

11. A control circuit controlling a voltage level of a pad and comprising:

a first output switch configured to provide a voltage from a first voltage source to the pad;

a second output switch configured to provide a ground voltage to the pad;

a core circuit coupled to the first voltage source and a second voltage source, wherein during a normal period, the core circuit controls the first and second output switches; and a power-on control circuit coupled to the first and second voltage sources, wherein during an initial period, the power-on control circuit controls the first and second output switches, the voltages provided by the first and second voltage sources are gradually increased during the initial period, and wherein the power-on control circuit comprises:

a detecting circuit detecting the voltage provided by the first voltage source to generate a detection signal to a first node;

a switching circuit coupled to the first and second voltage sources and transmitting the voltage provided by the first or second voltage sources to a second node according to the signal of the first node; and a setting circuit coupled to the first and second nodes, controlling the first and second output switches according to a voltage level of the second node, and generating a feedback signal to the first node;

wherein when the voltage provided by the first voltage source reaches a first pre-determined value and the voltage provided by the second voltage source has not reached a second pre-determined value, the switching circuit transmits the voltage provided by the second voltage source to the second node according to the detection signal, and wherein when the voltage provided by the first voltage source reaches the first pre-determined value and the voltage provided by the second voltage source reaches the second pre-determined value, the switching circuit transmits the voltage provided by the first voltage source to the second node according to the feedback signal.

12. The power-on control circuit as claimed in claim 11, wherein the detecting circuit comprises:

a P-type transistor comprising a source, a drain and a gate, wherein the source of the P-type transistor is coupled to the first voltage source, the drain of the P-type transistor is coupled to the first node, and the gate of the P-type transistor is coupled to the second node.

13. The power-on control circuit as claimed in claim 11, wherein the detecting circuit comprises:

an inverter comprising an input terminal and an output terminal, wherein the input terminal is coupled to the second node; and an N-type transistor comprising a drain, a source and a gate, wherein the drain of the N-type transistor is coupled to the first voltage source, the source of the N-type transistor is coupled to the first node, and the gate of the N-type transistor is coupled to the output terminal of the inverter.

14. The power-on control circuit as claimed in claim 11, wherein the switching circuit comprises:

a P-type transistor comprising a first source, a first drain and a first gate, wherein the first source of the P-type transistor is coupled to the first voltage source, the first drain of the P-type transistor is coupled to the second node, and the first gate of the P-type transistor is coupled to the first node; and an N-type transistor comprising a second drain, a second source, and a second gate, wherein the second drain of the N-type transistor is coupled to the second voltage source, the source of the N-type transistor is coupled to the second node, and the second gate of the N-type transistor is coupled to the first node.

15. The power-on control circuit as claimed in claim 11, wherein the switching circuit comprises:
   a first P-type transistor comprising a first source, a first drain and a first gate, wherein the first source of the first P-type transistor is coupled to the first voltage source, the first drain of the first P-type transistor is coupled to the second node, and the first gate of the first P-type transistor is coupled to the first node;
   an inverter comprising an input terminal coupled to the first node; and
   a second P-type transistor comprising a second source, a second drain and a second gate, wherein the second source of the second P-type transistor is coupled to the second voltage source, the second drain of the second P-type transistor is coupled to the second node, and the second gate of the second P-type transistor is coupled to an output terminal of the inverter.

16. The power-on control circuit as claimed in claim 11, wherein the switching circuit comprises:
   an inverter comprising an input terminal coupled to the first node;
   a first N-type transistor comprising a first drain, a first source and a first gate, wherein the first drain of the first N-type transistor is coupled to the first voltage source, the first source of the first N-type transistor is coupled to the second node, and the first gate of the first N-type transistor is coupled to an output terminal of the inverter; and
   a second N-type transistor comprising a second drain, a second source and a second gate, wherein the second drain of the second N-type transistor is coupled to the second voltage source, the second source of the second N-type transistor is coupled to the second node, and the second gate of the second N-type transistor is coupled to the first node.

17. The power-on control circuit as claimed in claim 11, wherein the setting circuit comprises:
   a buffer coupled to the second node and outputting a first control signal to control the first output switch;
   a first inverter generating a second control signal to control the second output switch according to the first control signal; and
   a second inverter generating the feedback signal according to the first control signal.

18. The power-on control circuit as claimed in claim 17, wherein the buffer comprises:
   a third inverter comprising an input terminal coupled to the second node; and
   a fourth inverter comprising an input terminal and an output terminal, wherein the input terminal of the fourth inverter is coupled to an output terminal of the third inverter, and the output terminal of the fourth inverter outputs the first control signal.

19. The power-on control circuit as claimed in claim 11, further comprising:
   a capacitor coupled to the second node to set the voltage level of the second node at an initial level.

20. The power-on control circuit as claimed in claim 11, wherein during the normal period, the voltage provided by the first voltage source is greater than the voltage provided by the second voltage source.

* * * * *